US010477701B2

(12) United States Patent
Liao et al.

(10) Patent No.: US 10,477,701 B2
(45) Date of Patent: Nov. 12, 2019

(54) CIRCUIT BOARD AND METHOD FOR MANUFACTURING THE SAME

(71) Applicant: Unimicron Technology Corp., Taoyuan (TW)

(72) Inventors: Po-Hsuan Liao, Taoyuan (TW); Wen-Fang Liu, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/836,937

(22) Filed: Dec. 11, 2017

(65) Prior Publication Data

US 2019/0124778 A1    Apr. 25, 2019

(30) Foreign Application Priority Data

Oct. 25, 2017  (TW) .............................. 106136764 A

(51) Int. Cl.
| | |
|---|---|
| *H05K 1/11* | (2006.01) |
| *H05K 1/18* | (2006.01) |
| *H01L 21/02* | (2006.01) |
| *H01L 21/31* | (2006.01) |
| *H01L 21/44* | (2006.01) |

(Continued)

(52) U.S. Cl.
CPC ............. *H05K 3/386* (2013.01); *H05K 1/036* (2013.01); *H05K 1/115* (2013.01); *H05K 3/002* (2013.01); *H05K 3/0023* (2013.01); *H05K 3/0041* (2013.01); *H05K 3/107* (2013.01); *H05K 2201/0191* (2013.01); *H05K 2201/0195* (2013.01); *H05K 2203/0522* (2013.01); *H05K 2203/1453* (2013.01)

(58) Field of Classification Search
CPC .. H05K 1/11; H05K 1/18; H01L 21/02; H01L 21/31; H01L 21/44; H01L 21/48; H01L 21/70; H01L 21/768; H01L 21/4763; H01L 23/00; H01L 23/48; H01L 23/52
USPC .... 173/262; 438/3, 393, 599, 618, 622, 629, 438/637, 644, 672; 257/4, 201, 202, 204, 257/208, 213, 408, 532, 637, 641, 751, 257/758, 760, 762, 774; 1/1; 174/262
See application file for complete search history.

(56) References Cited

U.S. PATENT DOCUMENTS 4,520,041 A * 5/1985 Aoyama ............. H01L 21/7684
257/641
8,268,722 B2 * 9/2012 Yu ..................... H01L 21/02074
257/753

(Continued)

FOREIGN PATENT DOCUMENTS

| CN | 1325262 A | 12/2001 |
|---|---|---|
| CN | 1373512 A | 10/2002 |

(Continued)

*Primary Examiner* — Xiaoliang Chen
(74) *Attorney, Agent, or Firm* — CKC & Partners Co., LLC

(57) ABSTRACT

A circuit board includes a substrate, a first dielectric layer, an adhesive layer, a second dielectric layer, and a conductive line. The first dielectric layer is disposed on the substrate. The adhesive layer is bonded to the first dielectric layer and has at least one through hole. The through hole has an inner wall. The second dielectric layer is disposed on the adhesive layer and has a second through hole communicated with the first through hole. The conductive line is located in the second through hole of the second dielectric layer and is in contact with the inner wall of the adhesive layer.

7 Claims, 11 Drawing Sheets

(51) Int. Cl.
    *H01L 21/48*     (2006.01)
    *H01L 21/70*     (2006.01)
    *H01L 21/768*    (2006.01)
    *H01L 21/4763*   (2006.01)
    *H01L 23/00*     (2006.01)
    *H01L 23/48*     (2006.01)
    *H01L 23/52*     (2006.01)
    *H05K 3/38*      (2006.01)
    *H05K 1/03*      (2006.01)
    *H05K 3/00*      (2006.01)
    *H05K 3/10*      (2006.01)

(56) References Cited

U.S. PATENT DOCUMENTS

| | | | | |
|---|---|---|---|---|
| 8,298,933 B2* | 10/2012 | Shaviv | C23C 14/025 | 438/622 |
| 8,298,936 B1* | 10/2012 | Rozbicki | C23C 14/046 | 257/E21.169 |
| 8,317,923 B1* | 11/2012 | Chattopadhyay | H01L 21/76834 | 118/697 |
| 8,430,992 B1* | 4/2013 | Chattopadhyay | H01L 21/76834 | 118/719 |
| 8,679,972 B1* | 3/2014 | Rozbicki | H01L 21/76805 | 438/662 |
| 8,765,596 B1* | 7/2014 | Pradhan | C23C 14/046 | 257/E21.582 |
| 8,829,661 B2 | 9/2014 | Lytle et al. | | |
| 9,087,844 B2* | 7/2015 | Kim | H01L 23/528 | |
| 9,420,695 B2 | 8/2016 | Su et al. | | |
| 9,633,896 B1* | 4/2017 | Damjanovic | H01L 21/76831 | |
| 2001/0010894 A1* | 8/2001 | Shin | H01L 21/7681 | 430/312 |
| 2001/0022388 A1* | 9/2001 | Yokoyama | H01L 21/02126 | 257/637 |
| 2001/0027009 A1* | 10/2001 | Matsubara | H01L 21/76807 | 438/618 |
| 2001/0036719 A1* | 11/2001 | Parikh | H01L 21/76808 | 438/599 |
| 2001/0045652 A1* | 11/2001 | Mori | H01L 23/53238 | 257/751 |
| 2002/0008323 A1* | 1/2002 | Watanabe | H01L 21/76807 | 257/758 |
| 2002/0027288 A1* | 3/2002 | Lee | H01L 27/10888 | 257/758 |
| 2002/0063338 A1* | 5/2002 | Mikami | H01L 21/76834 | 257/762 |
| 2002/0079586 A1* | 6/2002 | Uchiyama | H01L 21/76807 | 257/758 |
| 2002/0086523 A1* | 7/2002 | Barth | H01L 21/76805 | 438/637 |
| 2003/0001267 A1* | 1/2003 | Watanabe | H01L 21/76807 | 257/758 |
| 2003/0077844 A1* | 4/2003 | Lee | H01L 27/10855 | 438/3 |
| 2003/0102522 A1* | 6/2003 | Lee | H01L 21/768 | 257/532 |
| 2004/0140486 A1* | 7/2004 | Lee | H01L 21/31144 | 257/208 |
| 2004/0164328 A1* | 8/2004 | Lee | H01L 27/10855 | 257/213 |
| 2004/0262638 A1* | 12/2004 | Mazoyer | H01L 27/10852 | 257/201 |
| 2005/0048767 A1* | 3/2005 | Matsumoto | H01L 21/76805 | 438/629 |
| 2006/0019491 A1* | 1/2006 | Soda | H01L 21/02063 | 438/638 |
| 2006/0194430 A1* | 8/2006 | Beck | H01L 21/76805 | 438/627 |
| 2006/0211240 A1* | 9/2006 | Chi | H01L 21/02123 | 438/644 |
| 2007/0082477 A1* | 4/2007 | Naik | H01L 21/76808 | 438/622 |
| 2009/0155975 A1* | 6/2009 | Park | H01L 28/60 | 438/393 |
| 2009/0302299 A1* | 12/2009 | Chang | H01L 21/76849 | 257/4 |
| 2011/0094779 A1 | 4/2011 | Tseng et al. | | |
| 2015/0262912 A1* | 9/2015 | Ting | H01L 23/481 | 257/774 |
| 2017/0164473 A1* | 6/2017 | Denda | H05K 1/113 | |
| 2017/0170130 A1* | 6/2017 | Kaneda | H01L 21/4857 | |

FOREIGN PATENT DOCUMENTS

| | | |
|---|---|---|
| JP | 2010-157589 A | 7/2010 |
| JP | 2014-229907 A | 12/2014 |
| TW | I349319 B | 9/2011 |
| TW | I506738 B | 11/2015 |

* cited by examiner

CIRCUIT BOARD AND METHOD FOR MANUFACTURING THE SAME

CROSS-REFERENCE TO RELATED APPLICATION

This application claims priority to Taiwan Application Serial Number 106136764, filed Oct. 25, 2017, which is herein incorporated by reference.

BACKGROUND

Field of Invention

The present disclosure relates to a circuit board, and especially relates to a method for manufacturing the circuit board.

Description of Related Art

A circuit board is a part needed for an electronic device, such as a mobile phone or a computer, and/or a household application, such as a television, a washing machine, or a refrigerator. In detail, a circuit board can carry a variety of electronic components, such as chips, passive components, active components, or a microelectromechanical system (MEMS) thereon. As such, current can be transmitted via the circuit board to the aforementioned electronic components, thereby operating the electronic device and/or the household application.

SUMMARY

The present disclosure provides a circuit board. The circuit board includes a substrate, a first dielectric layer, an adhesive layer, a second dielectric layer, and a conductive line. The first dielectric layer is disposed on the substrate. The adhesive layer is bonded to the first dielectric layer and has at least one through hole. The through hole has an inner wall. The second dielectric layer is disposed on the adhesive layer and has a second through hole communicated with the first through hole. The conductive line is located in the second through hole of the second dielectric layer and is in contact with the inner wall of the adhesive layer.

In some embodiments of the present disclosure, the adhesive layer has a top surface opposite to the substrate. The top surface is in contact with the second dielectric layer.

In some embodiments of the present disclosure, the circuit board further includes at least one conductive contact. The first dielectric layer has at least one conductive hole. The conductive contact is located in the conductive hole and is in contact with the substrate. The adhesive layer has a third through hole. The third through hole is exposed between the first dielectric layer and the second dielectric layer, faces toward the conductive hole, and is in contact with the conductive contact.

The present disclosure provides a method for manufacturing a circuit board. The method includes forming a patterned first dielectric layer on a substrate; forming an adhesive layer on the patterned first dielectric layer; forming a second dielectric layer on the adhesive layer; and patterning the second dielectric layer and the adhesive layer.

In some embodiments of the present disclosure, the forming the adhesive layer on the patterned first dielectric layer includes: bonding the adhesive layer to the patterned first dielectric layer, such that the adhesive layer covers the patterned first dielectric layer and the substrate.

In some embodiments of the present disclosure, the patterning the second dielectric layer and the adhesive layer includes: performing an exposure process to the second dielectric layer; and performing a developing process to the exposed second dielectric layer to expose a portion of the adhesive layer.

In some embodiments of the present disclosure, the patterning the second dielectric layer and the adhesive layer includes: removing the portion of the adhesive layer to at least expose at least a portion of the patterned first dielectric layer.

In some embodiments of the present disclosure, the removing the portion of the adhesive layer is performed by a wet etching process.

In some embodiments of the present disclosure, the method further includes: forming a conductive layer on the substrate before the forming the patterned first dielectric layer on the substrate, in which the conductive layer is separated from the adhesive layer by the patterned first dielectric layer.

In some embodiments of the present disclosure, the method further includes: filling a conductive material at least in the patterned second dielectric layer, such that the conductive material is in contact with the patterned adhesive layer.

In the aforementioned configurations, the first dielectric layer can be bonded to the second dielectric layer by the first adhesive layer, thereby preventing the circuit board from having a problem due to a poor bonding force between dielectric layers, and enhancing the structural strength of the circuit board. Furthermore, the first adhesive layer is formed between the first dielectric layer and the second dielectric layer, and the conductive line is bonded by contacting the inner wall of the first adhesive layer, such that when the contact area between the fine line and the dielectric layer is small, the first adhesive layer can improve the bonding force between the first dielectric layer and the second dielectric layer, thereby reducing the probability of separating the fine line from the dielectric layer and realizing the miniaturization of the conductive line so that the circuit board can be thinned and miniaturized.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
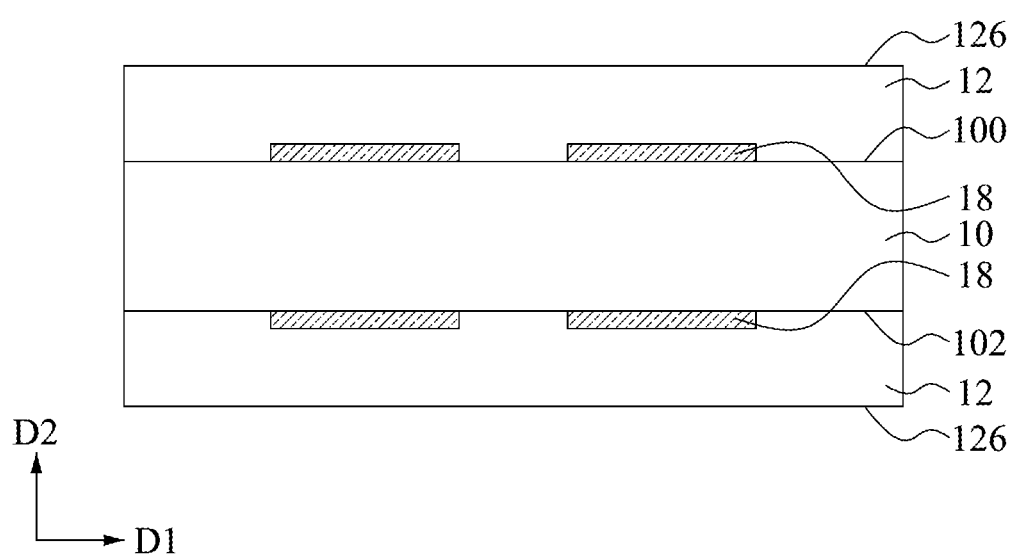
FIGS. 1-16 are cross-sectional views of a circuit board at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIGS. 1-16. FIGS. 1-16 are cross-sectional views of a circuit board 1 (labeled in FIG. 16) at various stages of fabrication in accordance with some embodiments of the present disclosure.

As shown in FIG. 1, a substrate 10 is provided. The substrate 10 of the present disclosure has a first surface 100 and a second surface 102 opposite to the first surface 100. The substrate 10 can be made by a ceramic plate, a metal plate, an organic board, or any other suitable structure. In the embodiment, a direction parallel to the substrate 10 is defined as the direction D1. Another direction orthogonal to the direction D1 is defined as the direction D2. The direction D2 is substantially orthogonal to the direction D1. In some embodiments, the direction D2 is non-orthogonal to the direction D1.

Subsequently, the conductive line layers 18 are formed on the first surface 100 and the second surface 102 of the substrate 10 respectively. Then, a first dielectric layers 12 are bonded to the first surface 100 and the second surface 102 of the substrate 10 respectively, such that the first dielectric layers 12 are in contact with the first surface 100 and the second surface 102 of the substrate 10 respectively and the conductive line layer 18 is embedded in the first dielectric layer 12. The first dielectric layer 12 of the present disclosure has a top surface 126 opposite to the substrate. Furthermore, in some embodiments, the first dielectric layer 12 has a thickness in a range from about 15 micrometers (μm) to about 40 μm, but the present disclosure is not limited thereto. For example, the first dielectric layer 12 of the present disclosure is in a range from about 25 μm to about 35 μm.

In the embodiment, the first dielectric layer 12 is made of a photoimageable dielectric (PID) material, and mechanisms of the photoimageable dielectric are not limited to positive or negative. For example, the first dielectric layer 12 of the present disclosure is made by material includes an epoxy resin film, a Ajinomoto Build-up Film (ABF), prepreg (PP), or any other suitable material. In the embodiment, a method for bonding the first dielectric layer 12 to the substrate 10 by pressing includes a vacuum pressing process, but the present disclosure is not limited thereto. Furthermore, a tool used for the vacuum pressing process of the present disclosure may include a batch single stage pressing tool or a batch multi-stage pressing tool.

Figure 2:
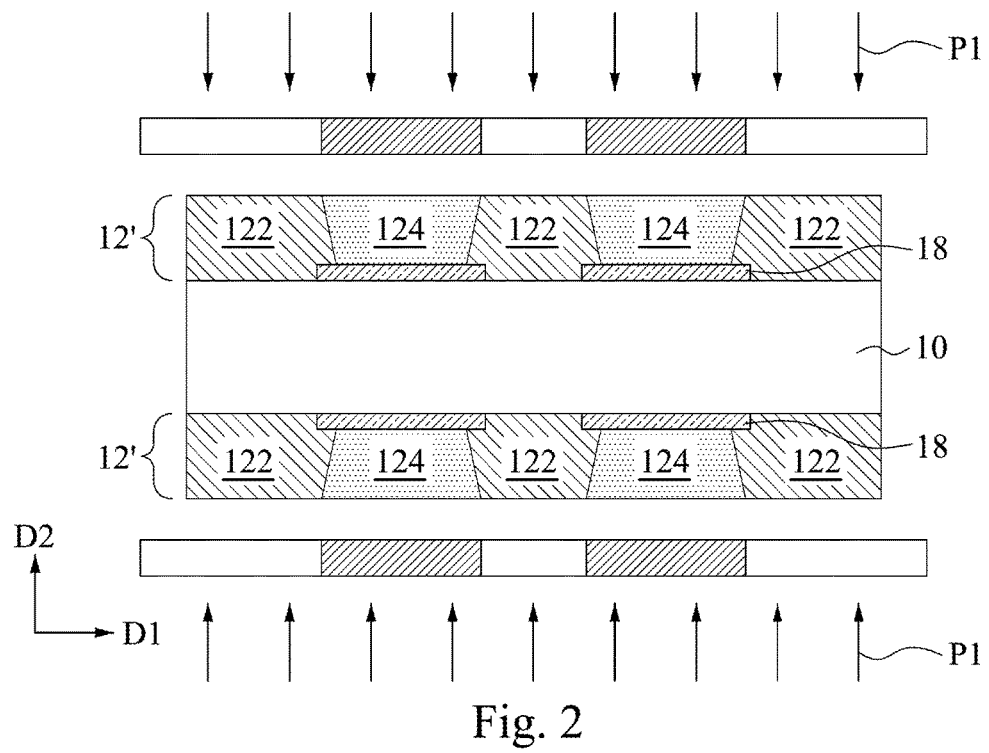

As shown in FIG. 2, after the first dielectric layer 12 is bonded to the substrate 10, the first dielectric layer 12 is to be patterned. Furthermore, an exposure process P1 is performed on the first dielectric layer 12, so as to form exposure regions 122 and non-exposure regions 124 on the first dielectric layer 12'. For example, a tool used for the exposure process P1 may include a direct imaging tool (DI), a laser direct imaging tool (LDI), a stepper tool, a contacting exposure tool, or any other suitable tool.

Figure 3:
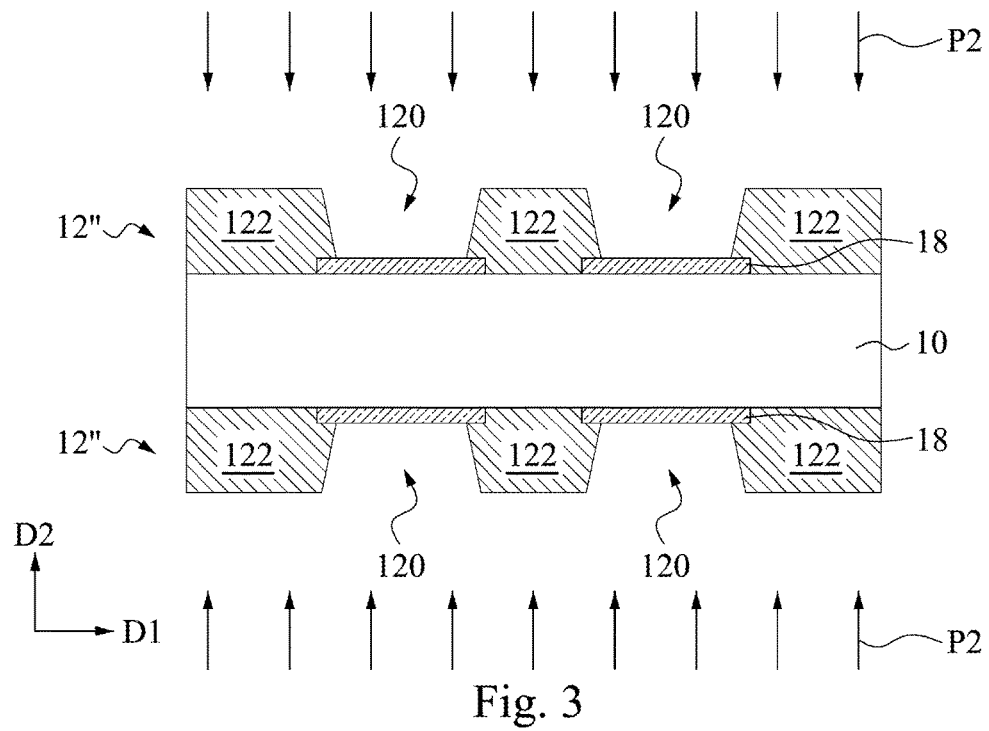

As shown in FIG. 3, after the exposure process P1 is performed on the first dielectric layer 12, a developing process P2 is performed on the exposed first dielectric layer 12', so as to form a patterned first dielectric layer 12" on the substrate 10. Furthermore, the non-exposure regions 124 of the exposed first dielectric layer 12' is removed by the developing process P2, and the exposure regions 122 of the exposed first dielectric layer 12' remain, such that conductive holes 120 and the patterned first dielectric layer 12" are formed. The conductive line layers 18 are exposed through the conductive holes 120 of the patterned first dielectric layer 12".

Then, after the developing process P2 is finished, a curing process P2 is performed on the patterned first dielectric layer 12" to cure the patterned first dielectric layer 12". In some embodiment, the curing process P2 can include thermal curing process, light curing process, any other suitable process, or combinations thereof.

Figure 4:
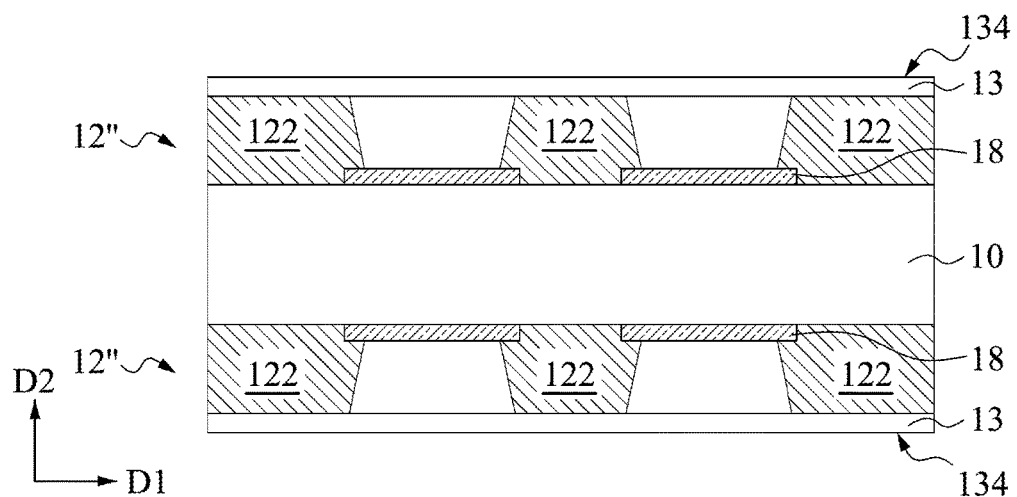

As shown in FIG. 4, after the patterned first dielectric layer 12" is formed, the first adhesive layer 13 is formed on the patterned first dielectric layer 12". Furthermore, the first adhesive layer 13 is bonded to the patterned first dielectric layer 12" by pressing, such that the first adhesive layer 13 covers the patterned first dielectric layer 12", the conductive line layers 18, and the substrate. The first adhesive layer 13 has a top surface 134 opposite to the substrate 10. Furthermore, the conductive line layers 18 are separated from the patterned first dielectric layer 12" by the first adhesive layer 13. In the embodiment, the first adhesive layer 13 is made by insulation material, and the thickness of the first adhesive layer 13 is in a range from about 5 μm to about 10 μm, but the present disclosure is not limited thereto. For example, the first adhesive layer 13 of the present embodiment can be made by epoxy, polyamide, polyester, any other suitable material, or combination thereof. In addition, in the embodiment, a method for bonding the first adhesive layer 13 to the patterned first dielectric layer 12" includes a vacuum pressing tool, a roller pressing tool, a thermal pressing tool, or any other suitable tool. A peeling temperature of the first adhesive layer 13 from the patterned first dielectric layer 12" is larger than 280° C., but the present disclosure is not limited thereto. The first adhesive layer 13 has a high resistance to a high energy ion bombardment etching or an electron bombardment etching compared to the second dielectric layer 14 formed by subsequent manufacturing (see FIG. 5), and thus during the subsequent removal process, a portion of the second dielectric layer 14 can be selectively removed but the first adhesive layer 13 remains.

Figure 5:
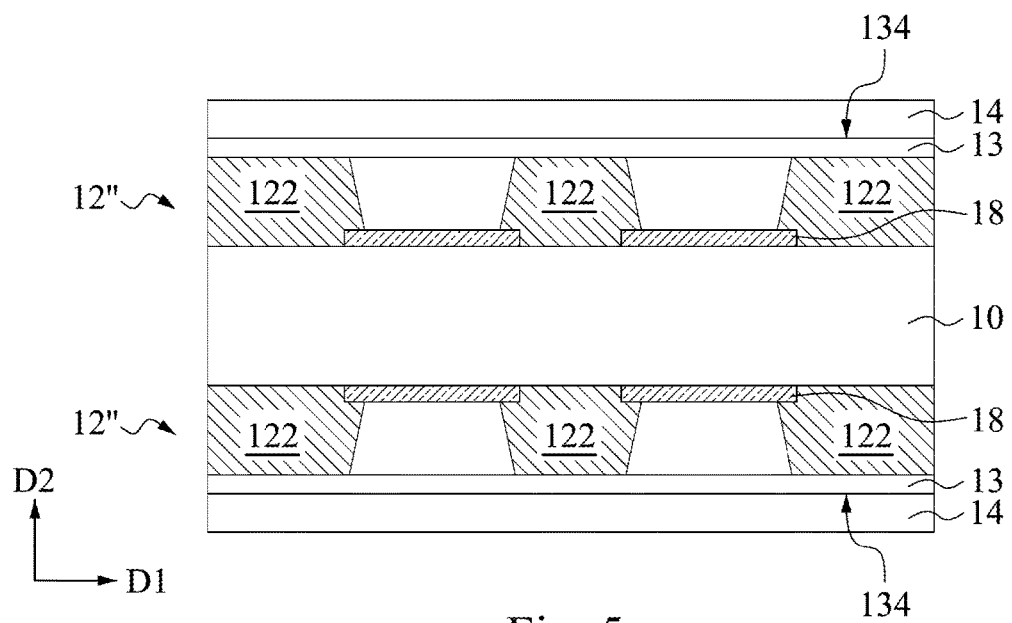

As shown in FIG. 5, after the first adhesive layer 13 is formed on the patterned first dielectric layer 12", the second dielectric layer 14 is formed on the first adhesive layer 13. That is, the top surface 134 of the first adhesive layer 13 is contact with and supports the second dielectric layer 14. In the embodiment, the second dielectric layer 14 is made by of photoimageable dielectric (PID) material. A thickness of the second dielectric layer 14 is in a range from about 5 μm to about 20 μm. Furthermore, the thickness of the second dielectric layer 14 is larger than the thickness of the first adhesive layer 13 in the direction D2, but the present disclosure is not limited thereto. In the embodiment, the second dielectric layer 14 is formed on the first adhesive layer 13 by a vacuum pressing tool. As such, the first adhesive layer 13 is used to combine the patterned first dielectric layer 12" and the second dielectric layer 14, thereby increasing the bonding force between the dielectric layers, and enhancing the structural strength of the circuit board 1.

Figure 6:
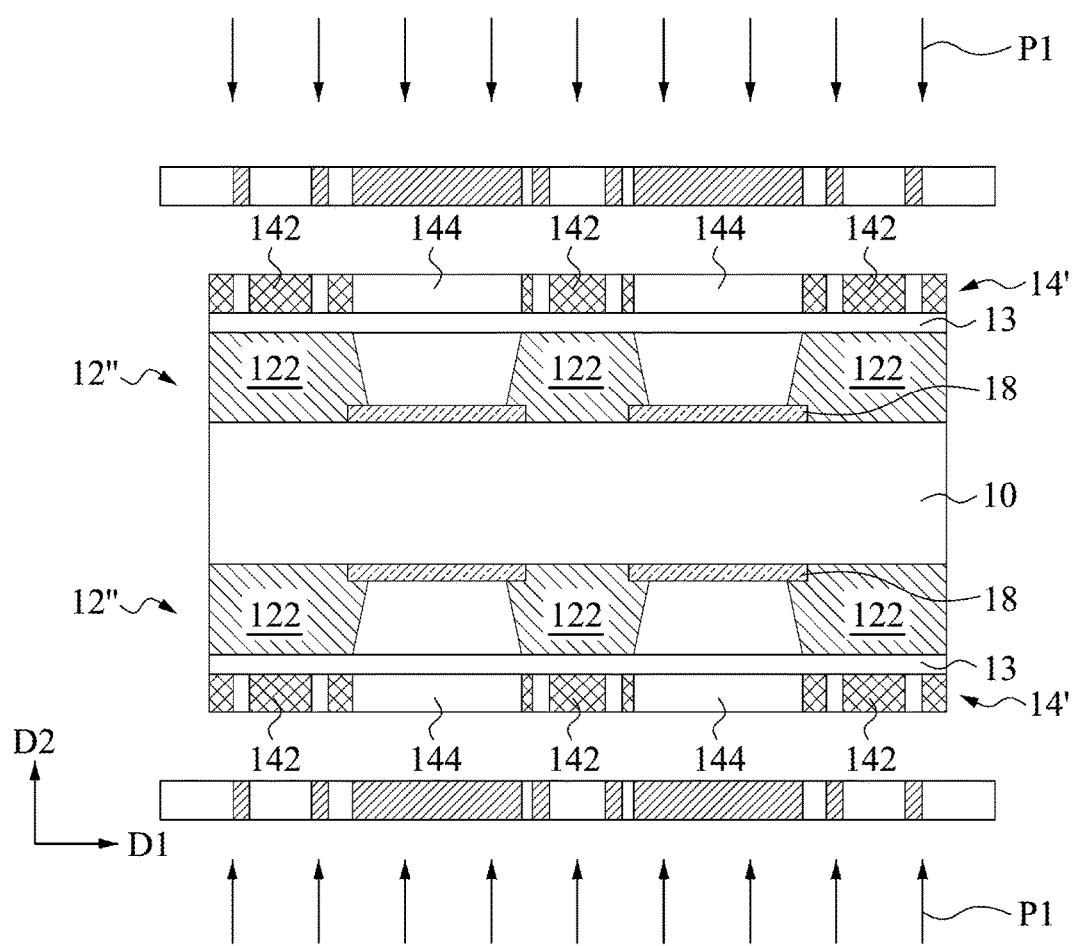

As shown in FIG. 6, after the second dielectric layer 14 is formed on the first adhesive layer 13, the second dielectric layer 14 is to be patterned. Furthermore, an exposure process P1 is performed on the second dielectric layer 14, so as to form exposure regions 142 and non-exposure regions 144 on the second dielectric layer 14'.

Figure 7:
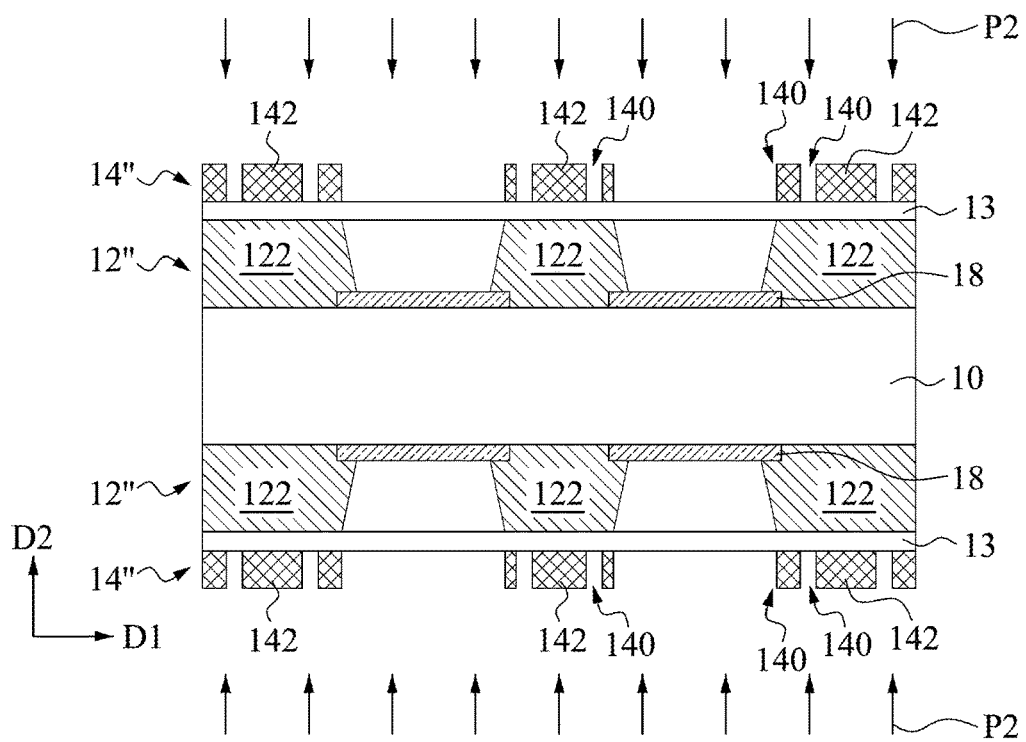

As shown in FIG. 7, after the second dielectric layer 14 is performed by the exposure process P1, the developing process P2 is performed on the exposed second dielectric layer 14', so as to form a patterned second dielectric layer 14" on the first adhesive layer 13. Furthermore, the non-exposure region 144 of the exposed second dielectric layer 14' is removed by the developing process P2, but the exposure region 142 of the exposed second dielectric layer 14' remains, such that through holes 140 and the patterned second dielectric layer 14" are formed. A portion of the first adhesive layer 13 is exposed through the through holes 140 of the patterned second dielectric layer 14". Then, after the developing process P2 is finished, a curing process is performed to cure the patterned second dielectric layer 14".

Figure 8:
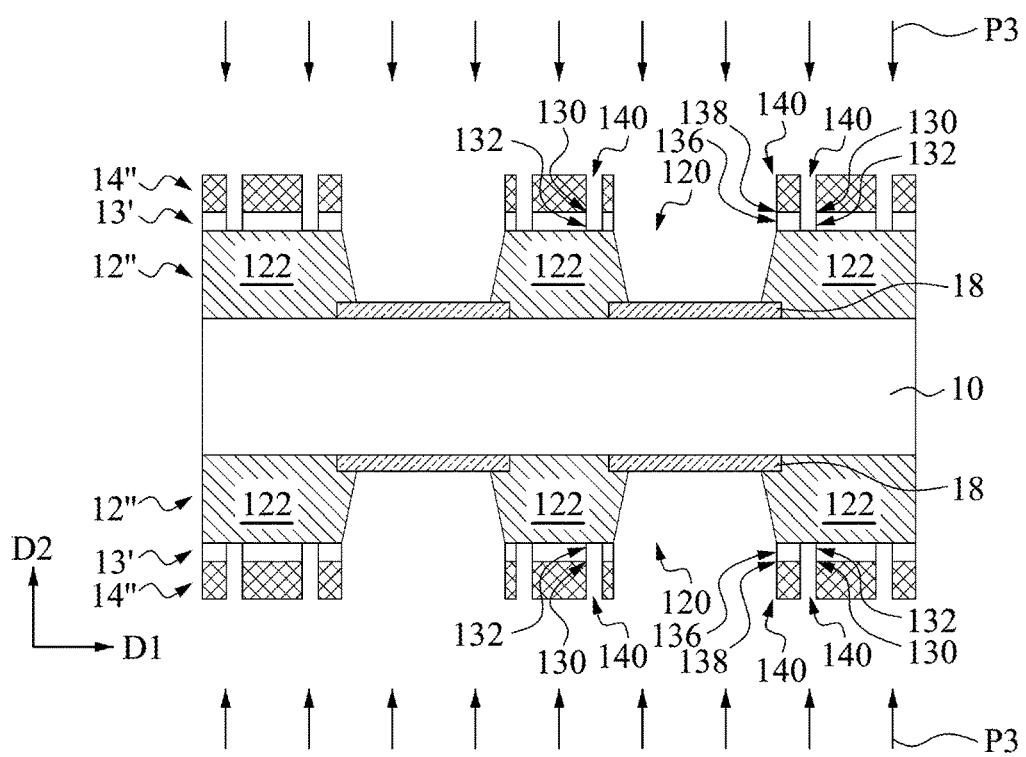

As shown in FIG. 8, after the patterned second dielectric layer 14" is formed, the first adhesive layer 13 is to be patterned. Furthermore, a portion of the first adhesive layer 13 is removed to form through holes 130 and through holes 138. In the present embodiment, the through holes 130 are located above the exposure regions 122, and the through holes 138 are located above the non-exposure regions 124. The through hole 130 and the through hole 138 of the patterned first adhesive layer 13' are communicated with the through holes 140 of the patterned second dielectric layer 14" and have an inner wall 132 and an inner wall 138 respectively. Specifically, the inner wall 136 of the through hole 138 is exposed between the first dielectric layer 12' and the second dielectric layer 14', and faces toward the conductive hole 120. In the present embodiment, A wet etching process P3 is performed to remove the portion of the first adhesive layer 13, but the present disclosure is not limited thereto. The solution used in the wet etching process P3 of the present embodiment includes acetone, methyl ethyl ketone, toluene, or combinations thereof.

Figure 9:
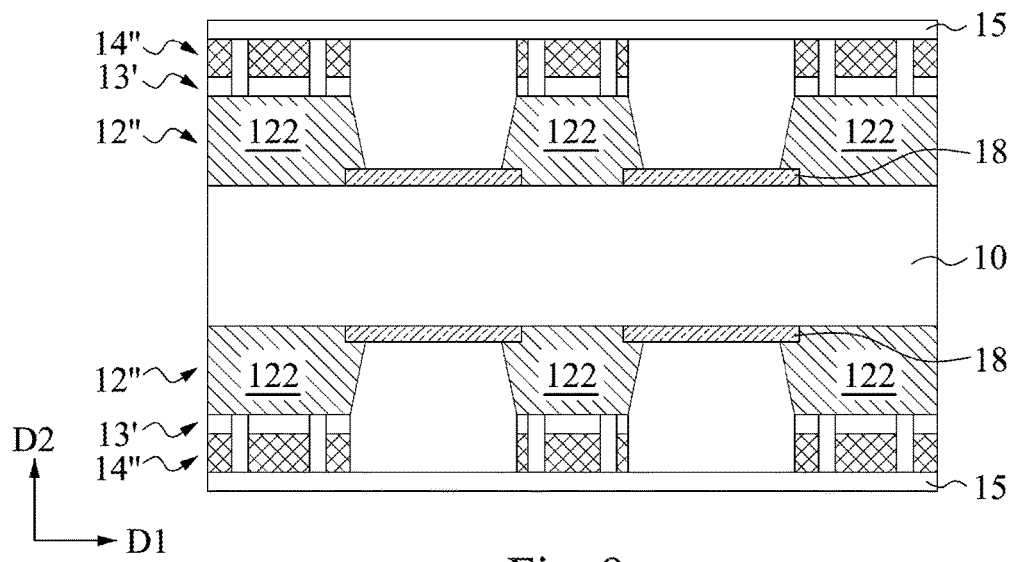

As shown in FIG. 9, after the patterned first adhesive layer 13' is formed, the patterned second dielectric layer 14" is further to be patterned. Firstly, a second adhesive layer 15 is formed on the patterned second dielectric layer 14", such that the mask layer 16 (see FIG. 10) formed by the subsequent process can be adhered to the patterned second dielectric layer 14" through the second adhesive layer 15. Furthermore, the second adhesive layer 15 of the present embodiment is bonded to the patterned second dielectric layer 14", such that the second adhesive layer 15 covers the patterned first dielectric layer 12", the patterned first adhesive layer 13', the patterned second dielectric layer 14", and the conductive line layers 18. In the embodiment, a peeling temperature of the second adhesive layer 15 from the patterned second dielectric layer 14" is lower than the peeling temperature of the patterned first adhesive layer 13' from the patterned first dielectric layer 12". The second adhesive layer 15 is made by insulation material, but the present disclosure is not limited thereto. In some embodiment, the second adhesive layer 15 is made of a material that can be softened by heating or a soluble material. For example, the second adhesive layer 15 can include epoxy, phenolic, any other suitable material, or combinations thereof.

Figure 10:
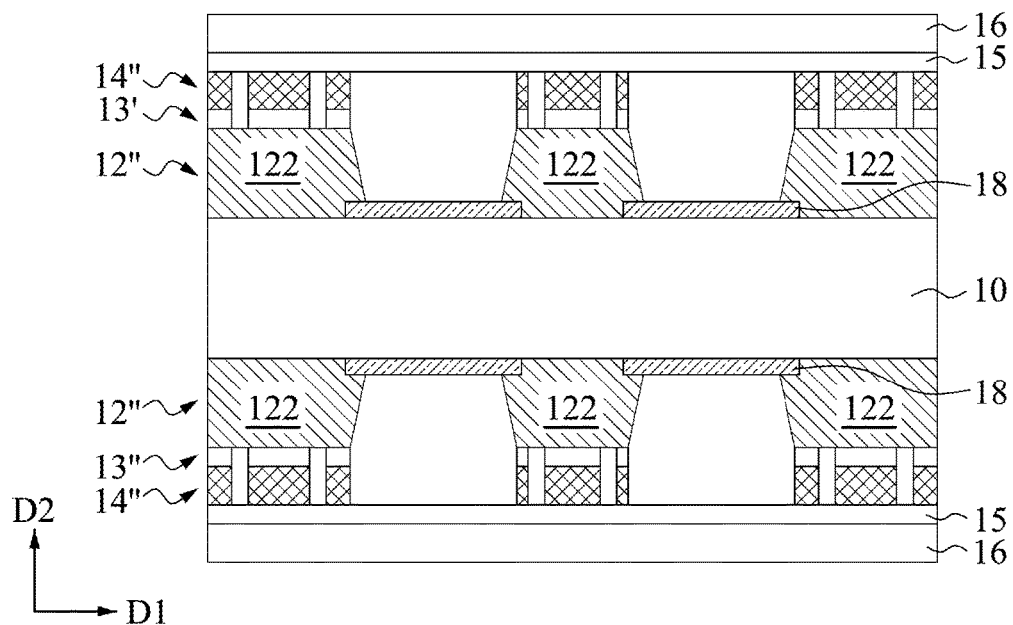

As shown in FIG. 10, after the second adhesive layer 15 is formed on the patterned second dielectric layer 14", the mask layer 16 is formed on the patterned second dielectric layer 14" and the second adhesive layer 15. In the embodiment, the mask layer 16 is made by a photoresist hard film.

Figure 11:
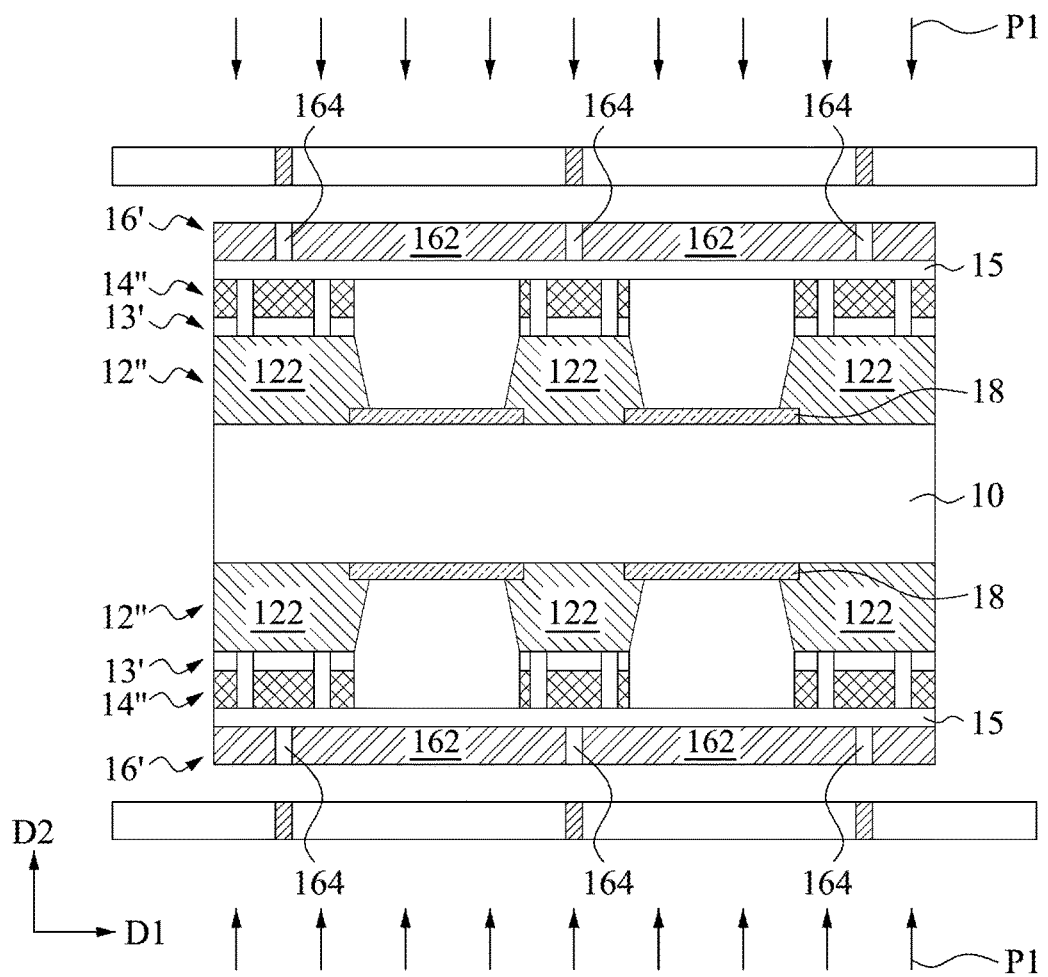

As shown in FIG. 11, after the mask layer 16 is formed on the second adhesive layer 15, the mask layer 16 is to be patterned. Furthermore, an exposure process P1 is performed on the mask layer 16, so as to form exposure regions 162 and non-exposure regions 164 on the mask layer 16'.

Figure 12:
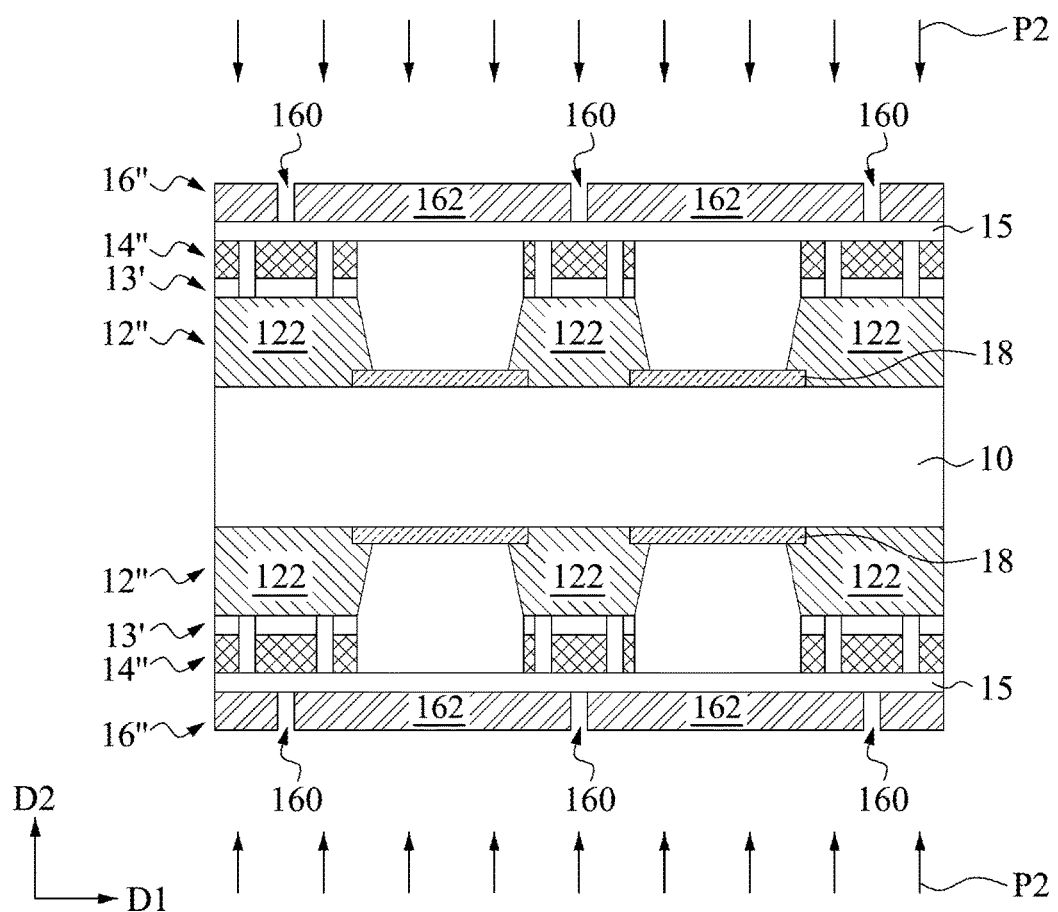

As shown in FIG. 12, after the exposure process P1 is performed on the mask layer 16, the developing process P2 is performed on the exposed mask layer 16', so as to form a patterned mask layer 16" on the second adhesive layer 15. Furthermore, the non-exposure regions 164 of the exposed mask layer 16' is removed by the developing process P2, but the exposure regions 162 of the exposed mask layer 16' remain, such that at least one opening 160 and the patterned mask layer 16" are formed. A portion of the second adhesive layer 15 is exposed through the opening 160 of the patterned mask layer 16". Then, after the developing process P2 is finished, a curing process is performed to cure the patterned mask layer 16".

Figure 13:
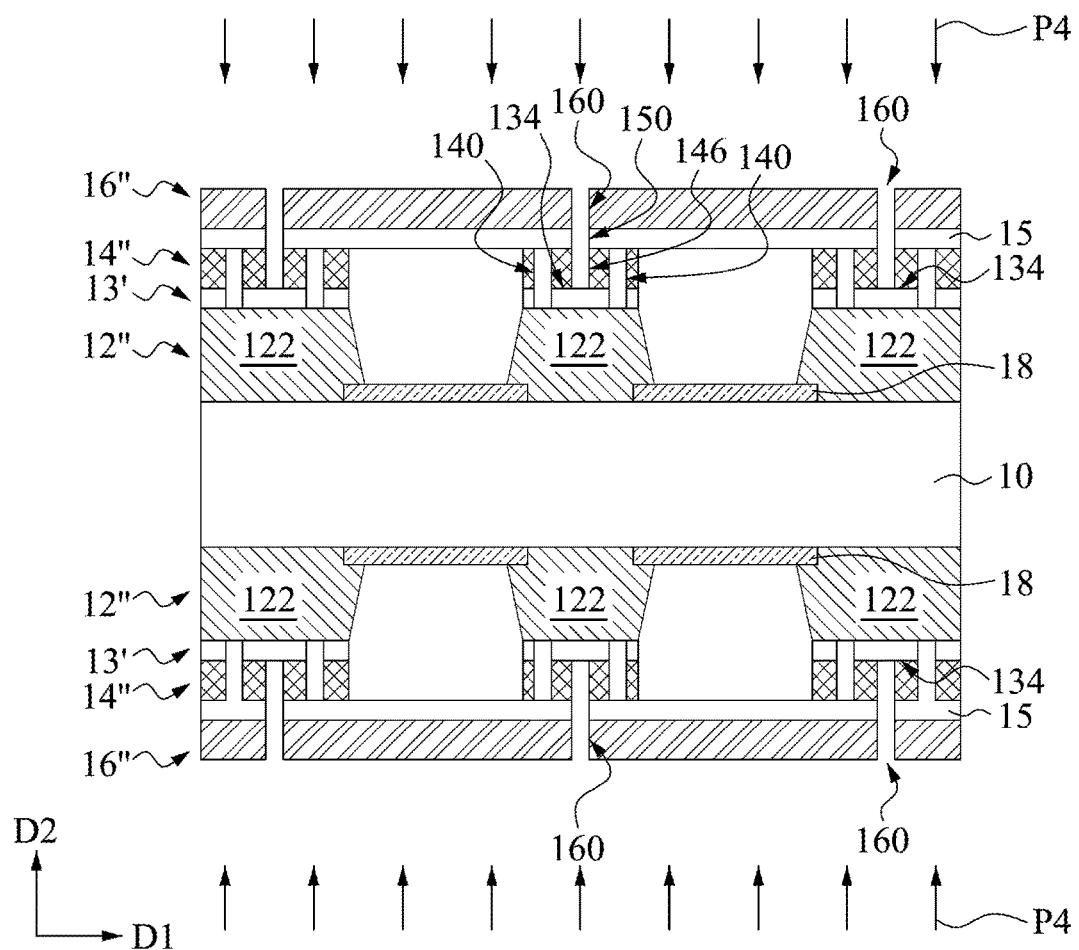

As shown in FIG. 13, after the patterned mask layer 16" is formed, a removing process is performed on the second adhesive layer 15 through the opening 160 of the patterned mask layer 16" and further performed on the patterned second dielectric layer 14" until a portion of the top surface 134 of the patterned first adhesive layer 13' is exposed. In the embodiment, the removing process for the second dielectric layer 14" is performed by a dry etching process P4. For example, the dry etching process P4 may include a plasma etching process, an ion beam etching process, a reactive ion etching process, or any other suitable process. Furthermore, the dry etching process P4 is performed on the second adhesive layer 15 and the patterned second adhesive layer 14" respectively to form through hole 150 and through hole 146 which are communicated with each other. In the embodiment, the through hole 146 of the second dielectric layer 14" is located between the two adjacent through holes 140. Furthermore, the patterned first adhesive layer 13' of the present embodiment can be act as an etching stop layer to determine the etching end point of the dry etching process P4.

The etching process can be used to form the through hole 146 through the patterned mask layer 16" instead of using the exposure process P1 and the developing process P2 to form the through hole 146 thereby preventing, such as the problem that the line width of the design cannot be achieved due to the poor resolution during the exposure process as the forming of a through hole for a fine line. As such, after the subsequent manufacturing process, the present embodiment can achieve the miniaturization of the circuit, and can accurately locate the position of the fine circuit through the dry etching process P4 and the patterned mask layer 16". For example, the width of the through hole 146 in the present embodiment in the direction D1 and the thickness of the through hole 146 in the direction D2 may be less than 5 μm, respectively.

Figure 14:
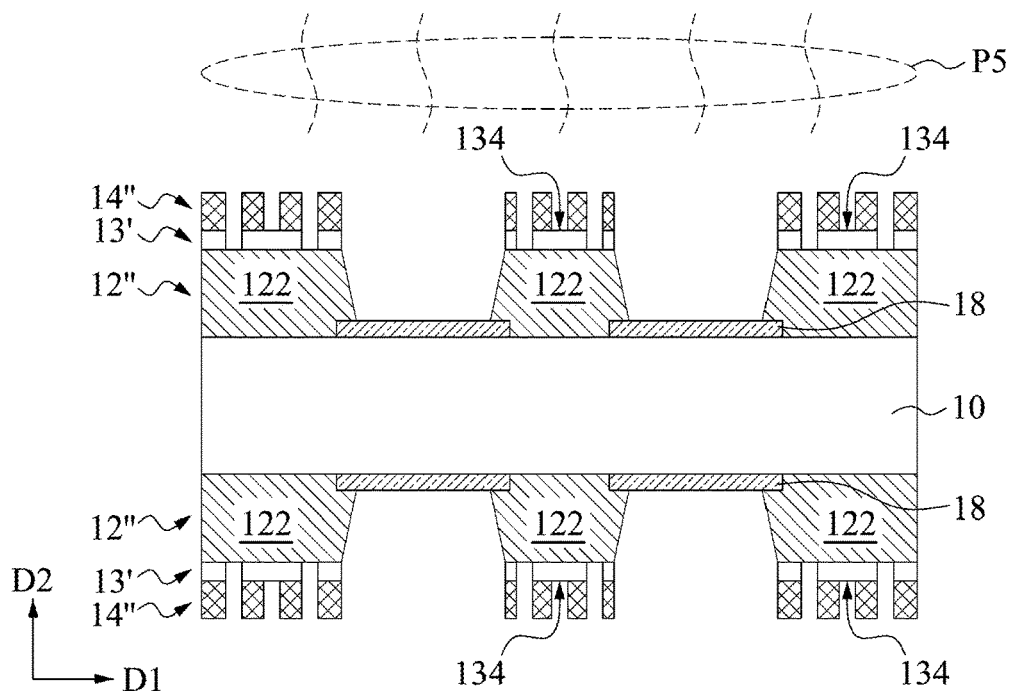

As shown in FIG. 14, after the portion of the top surface 134 of the patterned first adhesive layer 13' is exposed, the patterned mask layer 16" is removed to expose the patterned second dielectric layer 14" and the top surface 134 of the first adhesive layer 13'. In the embodiment, a method for removing the patterned mask layer 16" includes thermal stripping process, but the present disclosure is not limited thereto. Specifically, the present embodiment utilizes the thermal stripping process P5 to peel off the second adhesive layer 15 (see FIG. 13) from the patterned second dielectric layer 14" to simultaneously release the patterned mask layer 16' from the patterned second dielectric layer 14". In some embodiments, the second adhesive layer 15 can also be peeled off from the patterned second dielectric layer 14" by using a laser stripping process, but the present disclosure is not limited thereto.

As such, the patterned mask layer 16" is bonded to the patterned second dielectric layer 14" by the patterned second adhesive layer 15. Therefore, the patterned mask layer 16" can be simultaneously removed by stripping the second adhesive layer 15, but without any additional process to remove the patterned mask layer 16". Therefore, the present embodiment can simplify the process steps of the circuit board 1, and can reduce the manufacturing cost of the circuit board 1.

Figure 15:
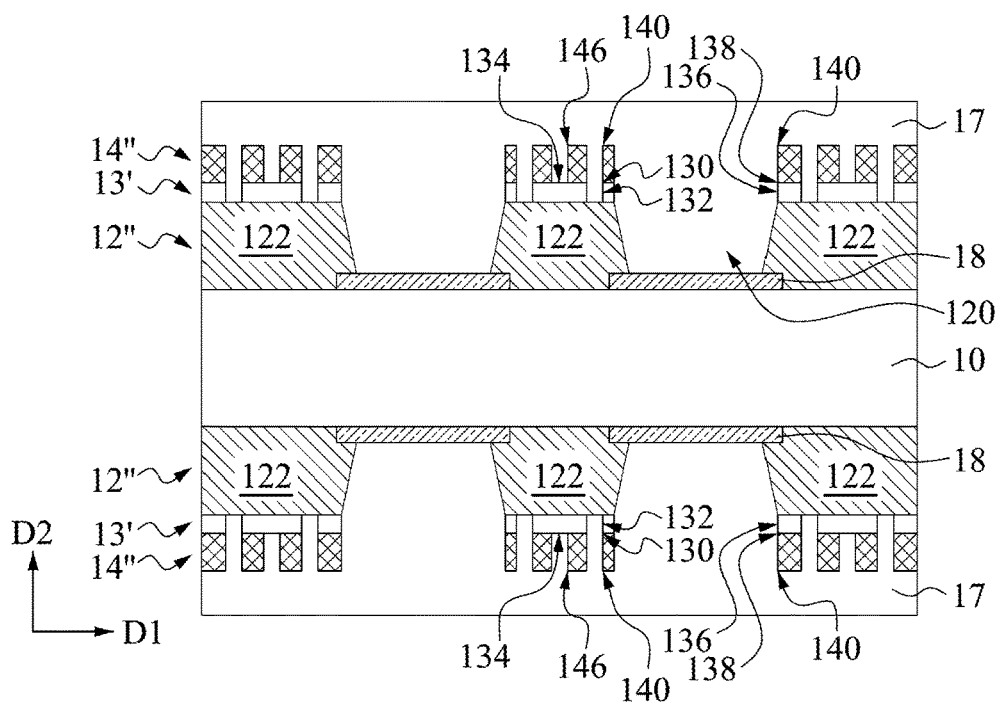

As shown in FIG. 15, after the second adhesive layer 15 and the patterned mask layer 16" are removed from the patterned second dielectric layer 14", the conductive material 17 are at least filled in the through hole 140 and the through hole 146 of the patterned second dielectric layer 14", and filled in the conductive hole 120 of the patterned first dielectric layer 12". Furthermore, the conductive material 17 in the through hole 149 further extends to the through hole 130 and the through hole 138 of the patterned first adhesive layer 13', is in contact with the inner wall 132 of the through hole 130, and is in contact with the inner wall 136 of the through hole 138. The conductive material 17 in the through hole 146 is in contact with the top surface 134 of the patterned first adhesive layer 13'.

In the present embodiment, the method for forming the conductive material 17 includes electroplating process, physical vapor deposition (PVD) process, or any other suitable process. In the present embodiment, the conductive material 17 is made of copper (Cu), but the present disclosure is not limited thereto. In some embodiments, the conductive material 17 may be made of, such as silver (Ag), nickel (Ni), gold (Au), palladium (Pd), any other suitable material, or combinations thereof.

Figure 16:
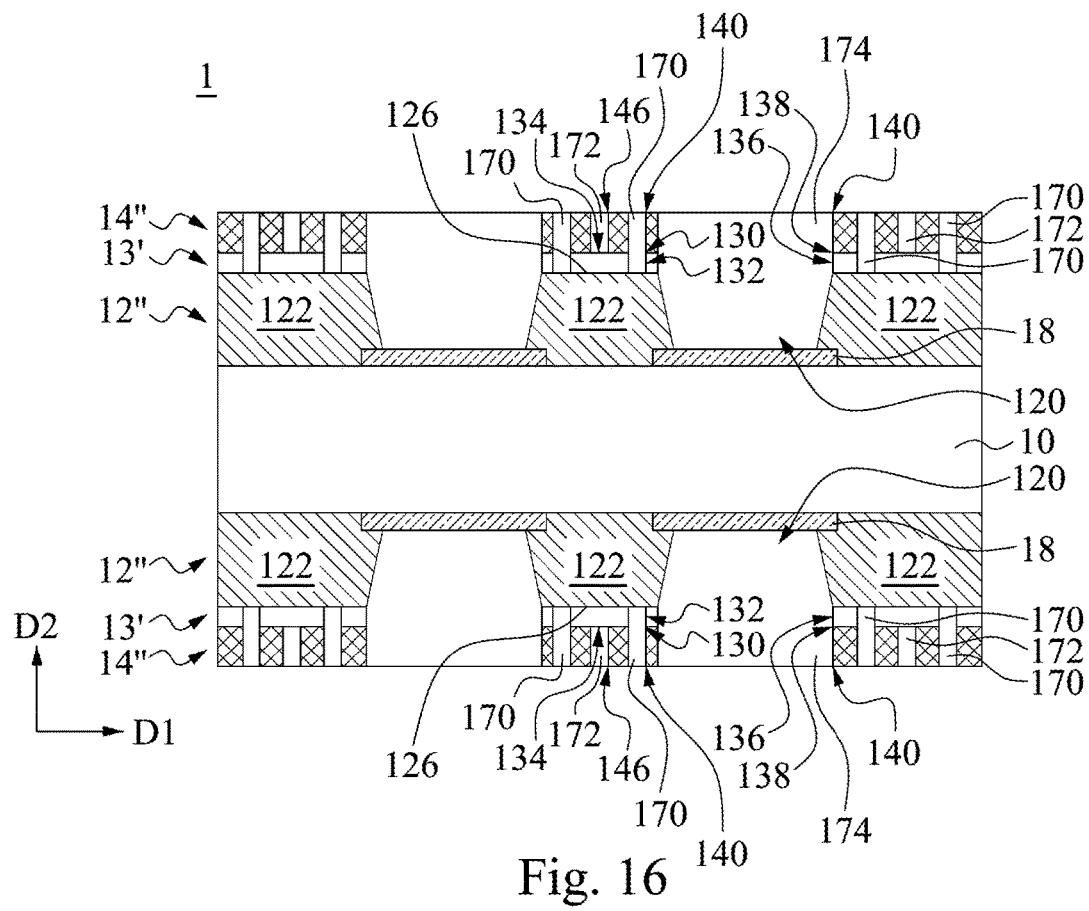

As shown in FIG. 16, after the conductive material 17 are at least filled in the patterned second dielectric layer 14", a planarization process is performed to form a plurality of conductive lines 170, conductive lines 172, and at least one conductive contact 174. Specifically, the planarization process of the present embodiment is performed to remove upper portion of the conductive material 17 to expose the patterned second dielectric layer 14", and simultaneously form lines embedded in the patterned second dielectric layer 14' (i.e., embedded line). For example, a portion of the conductive material 17 at least located in the through hole 140 forms the conductive line 170, another portion of the conductive material 17 located in the through hole 146 forms the conductive line 172, and another portion of the conductive material 17 at least located in the conductive hole 120 forms the conductive contact 174.

Specifically, the conductive lines 170 of the present embodiment penetrate through the patterned first adhesive layer 13' and the patterned second dielectric layer 14", and are located in the through hole 130, 138, and 140 to form the embedded fine lines. More specifically, the thickness of the conductive line 170 is less than 10 µm, and the line width of the conductive line 170 is less than 10 µm, but the present disclosure is not limited thereto. Furthermore, where the contact area between the fine line and the dielectric layer is small, a binding force between the fine line and the dielectric layer will be lower, thereby increasing the probability of separating the fine line from the dielectric layer.

However, the conductive line 170 of the present embodiment is in contact with the inner wall 132 of the through hole 130, and is in contact with the top surface 126 of the patterned first dielectric layer 12". As such, since the patterned first adhesive layer 13' is formed between the patterned first dielectric layer 12" and the second dielectric layer 14" and in contact to bonds the conductive line 170 by the inner wall 132 thereof, the patterned first adhesive layer 13' can improve the bonding force among the conductive line 170, the patterned first dielectric layer 12", and the patterned second dielectric layer 14".

Furthermore, the conductive line 172 is located in the through hole 146 of the patterned second dielectric layer 14", and is located between the two adjacent conductive lines 172 to form the embedded fine line. Specifically, the thickness of the conductive line 172 of the present embodiment and the line width of the conductive line 172 may be less than 5 µm, respectively, but the present disclosure is not limited thereto.

The conductive line 172 of the present embodiment is in contact with the top surface 134 of the patterned first adhesive layer 13'. As such, since the top surface 134 of the patterned first adhesive layer 13' is in contact with and bonds to the conductive line 172, the patterned first adhesive layer 13' can improve the bonding force among the conductive line 172, the patterned first dielectric layer 12", and second dielectric layer 14" to prevent the circuit board 1 from having a problem due to a poor bonding force between metal and dielectric layer.

In addition, the conductive contact 174 of the present embodiment is located in the conductive hole 120 of the patterned first dielectric layer 12", is in contact with the conductive line layer 18, and is in contact with the inner wall 136 of the patterned first adhesive layer 13'. As such, since the inner wall 136 of the patterned first adhesive layer 13' is in contact with and bonds to the conductive contact 174, the patterned first adhesive layer 13' can improve the bonding force among the conductive contact 174, the patterned first dielectric layer 12", and the second dielectric layer 14".

In the present embodiment, the planarization process may be performed by scrubbing process, chemical mechanical polishing (CMP) process, or any other suitable process.

Figure 17:
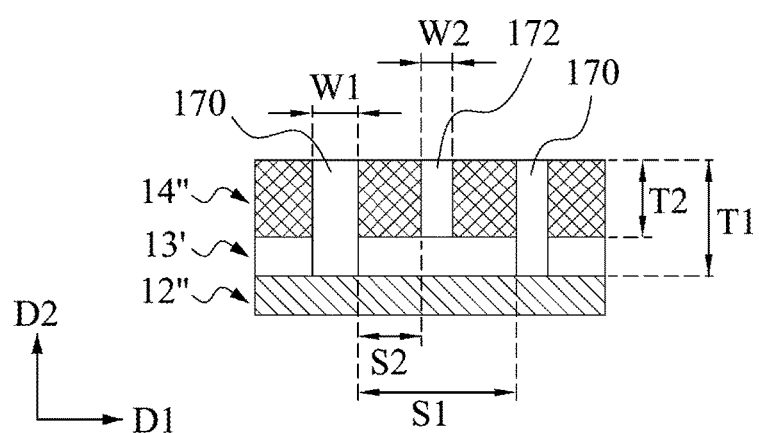
FIG. 17 is an enlarge view of a part of the structure show in FIG. 16.

Reference is made to FIG. 17. FIG. 17 is an enlarge view of a part of the structure show in FIG. 16. As shown in FIG. 17, in the present embodiment, the conductive line 170 and the conductive line 172 respectively have a line width W1 and a line width W2 in the direction D1, and respectively have a thickness T1 and a thickness T2 in the direction D2. For example, the line width W1 and the thickness T1 of the conductive line 170 are less than 10 µm respectively, and the line width W2 and the thickness T2 of the conductive line 172 are less than 10 µm respectively, but the present disclosure is not limited thereto.

Furthermore, in the present embodiments, the two adjacent conductive lines 170 are separated by a distance S1, and the adjacent conductive line 170 and conductive line 172 are separated by a distance S2. In some embodiment, the line width W1 and the thickness T1 of the conductive line 170, the line width W2 and the thickness T2 of the conductive line 172, the distance S1 of the two adjacent conductive lines 170, and the distance S2 of the adjacent conductive line 170 and conductive line 172 satisfy the following equations:

$0.5 \leq W2/W1 \leq 1;$ $T2 < T1$ $1.5 \leq S1/W1 \leq 3;$ and $0.5 \leq S2/W2 \leq 1;$ That is, in the present embodiment, the line width W2 of the conductive line 172 is less than or substantially equal to the line width W1 of the conductive line 170, but larger than or substantially equal to half of the line width W1 of the conductive line 170. The thickness T2 of the conductive line 172 is less than the thickness T1 of the conductive line 170, but the present disclosure is not limited thereto.

Furthermore, the distance S1 of the two adjacent conductive lines 170 is less than or substantially equal to three times of the line width W1 of the conductive line 170, but larger than or substantially equal to the 1.5 times of the line width W1 of the conductive line 170. The distance S2 of the adjacent conductive line 170 and conductive line 172 is less than or substantially equal to the line width W2 of the conductive line 172, but larger than or substantially equal to the line width W2 of the conductive line 172, but the present disclosure is not limited thereto. That is, the conductive line 172 manufactured by the present embodiment can have the line width W2 that is substantially less than the line width W1 of the conductive line 170 and can be disposed in a space with a smaller allowable tolerance so that the circuit board 1 can be thinned and miniaturized.

According to the foregoing embodiments of the disclosure, it can be seen that, the first dielectric layer can be bonded to the second dielectric layer by the first adhesive layer, thereby preventing the circuit board from having a problem due to a poor bonding force between the dielectric layers, and enhancing the structural strength of the circuit board. In addition, since the mask layer is adhered to the second dielectric layer by the second adhesive layer, the mask layer can be simultaneously removed by stripping the second adhesive layer, but without any additional process to remove the mask layer. Therefore, the present embodiment can simplify the process steps of the circuit board, and can reduce the manufacturing cost of the circuit board.

Furthermore, the first adhesive layer is formed between the first dielectric layer and the second dielectric layer, and the conductive line is bonded by contacting the inner wall and/or the top surface of the first adhesive layer, thereby enabling the first adhesive layer improve the bonding force between the first dielectric layer and the second dielectric layer.

In addition, the etching process can be used to form the through hole 146 on the dielectric layer through the patterned mask layer instead of using the exposure process and the developing process to form the through hole 146, thereby preventing, such as the problem that the line width of the design cannot be achieved due to the poor resolution during exposure when the forming of a through hole for a fine line. As such, the miniaturization of the line can be realized in this embodiment after the subsequent manufacturing process. Furthermore, the present embodiment can accurately locate the position of the fine circuit through the dry etching process and the patterned mask layer. That is, the conductive line manufactured by the present embodiment can have a smaller line width and can be disposed in a space with a smaller allowable tolerance so that the circuit board can be thinned and miniaturized.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A circuit board, comprising:
   a substrate comprising a metal-containing board, a ceramic-containing board, or an organic-containing board;
   a first dielectric layer disposed on the substrate;
   a conductive layer between the substrate and the first dielectric layer;
   an adhesive layer bonded to the first dielectric layer and having a first through hole;
   a second dielectric layer disposed on the adhesive layer and having a second through hole communicated with the first through hole;
   a conductive line located in the first through hole of the adhesive layer and the second through hole of the second dielectric layer and in contact with a top surface of the first dielectric layer; and
   a conductive contact passing through the first and second dielectric layers and in contact with a top surface of the conductive layer and the adhesive layer.

2. The circuit board of claim 1, wherein the adhesive layer has a top surface opposite to the substrate and the top surface is in contact with the second dielectric layer.

3. The circuit board of claim 1, wherein the first dielectric layer comprises a photoimageable dielectric (PID) material and the adhesive layer is in contact with the PID material of the first dielectric layer.

4. The ircuit board of claim 1, wherein the second dielectric layer comprises a photoimageable dielectric (PID) material and the adhesive layer is in contact with the PID material of the second dielectric layer.

5. The circuit board of claim 1, wherein the first dielectric layer comprises a photoimageable dielectric (PID) material and the substrate is in contact with the the PID material of the first dielectric layer.

6. The circuit board of claim 1, wherein the first dielectric layer comprises a photoimageable dielectric (PID) material and the conductive layer is in contact with the PID material of the first dielectric layer.

7. The circuit board of claim 1, wherein the first dielectric layer comprises a photoimageable dielectric (PID) material and the conductive contact has a bottommost portion that is in contact with the PID material of the first dielectric layer.

* * * * *